United States Patent
Pham et al.

(10) Patent No.: US 9,252,722 B2
(45) Date of Patent: Feb. 2, 2016

(54) ENHANCED AND VERSATILE N-WAY DOHERTY POWER AMPLIFIER

(71) Applicant: Telefonaktiebolaget L M Ericsson (publ), Stockholm (SE)

(72) Inventors: Bi Pham, Ottawa (CA); Somsack Sychaleun, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 89 days.

(21) Appl. No.: 14/136,981

(22) Filed: Dec. 20, 2013

(65) Prior Publication Data

US 2015/0180428 A1    Jun. 25, 2015

(51) Int. Cl.
    *H03F 3/68*     (2006.01)
    *H03F 1/56*     (2006.01)
    *H03F 1/02*     (2006.01)
    *H03F 1/48*     (2006.01)
    (Continued)

(52) U.S. Cl.
    CPC .............. *H03F 1/56* (2013.01); *H03F 1/0288* (2013.01); *H03F 1/48* (2013.01); *H03F 3/211* (2013.01); *H03F 3/602* (2013.01); *H03F 2200/36* (2013.01); *H03F 2200/405* (2013.01); *H03F 2200/408* (2013.01); *H03F 2203/21139* (2013.01); *H03F 2203/21142* (2013.01)

(58) Field of Classification Search
    CPC ................................. H03F 1/0288; H03F 3/68
    USPC .............................................. 330/124 R, 295
    See application file for complete search history.

(56) References Cited

U.S. PATENT DOCUMENTS

| 6,522,201 B1 | 2/2003 | Hsiao et al. |
| 7,521,995 B1 | 4/2009 | Krvavac et al. |

(Continued)

FOREIGN PATENT DOCUMENTS

| EP | 2403135 A1 | 1/2012 |
| EP | 2413498 A1 | 2/2012 |

(Continued)

OTHER PUBLICATIONS

Grebennikov, Andrei. "A High-Efficiency 100-W Four-Stage Doherty GaN HEMT Power Amplifier Module for WCDMA Systems." Microwave Symposium Digest (MTT), 2011 IEEE MTT-S International, pp. 1-4, Jun. 5-10, 2011.

(Continued)

*Primary Examiner* — Steven J Mottola
(74) *Attorney, Agent, or Firm* — Murphy, Bilak & Homiller, PLLC

(57) ABSTRACT

The output of a carrier amplifier circuit in a Doherty amplifier is coupled to the summing node so that the impedance observed by the carrier amplifier's output is approximately equal to the load impedance at the combining node when the load impedance is not modulated. In an example non-inverting configuration, a power amplifier circuit is configured to provide an amplified signal to a load at a summing node, where the load has a first impedance when not load-modulated. The power amplifier circuit includes a splitter network arranged to receive the input signal and to split the input signal to provide a carrier input signal and a peaking input signal, a carrier amplifier path configured to amplify the carrier input signal in a full-power mode and in a first backoff mode, and a peaking amplifier path configured to amplify the peaking input signal in at least the full-power mode.

8 Claims, 10 Drawing Sheets

NON-INVERTING

(51) Int. Cl.
*H03F 3/60* (2006.01)
*H03F 3/21* (2006.01)

(56) References Cited

U.S. PATENT DOCUMENTS

| | | | |
|---|---|---|---|
| 8,384,482 B2 | 2/2013 | Wilson et al. | |
| 2011/0140775 A1 | 6/2011 | Hong et al. | |
| 2011/0204974 A1* | 8/2011 | Woo et al. | 330/124 R |
| 2012/0319780 A1* | 12/2012 | Wilson et al. | 330/295 |

FOREIGN PATENT DOCUMENTS

| | | |
|---|---|---|
| WO | 0254589 A2 | 7/2002 |
| WO | 2012149976 A1 | 11/2012 |

OTHER PUBLICATIONS

Wood et al. "A High Efficiency Doherty Amplifier with Digital Predistortion for WiMAX." High Frequency Electronics. 2008.

Moon et al. "Efficiency Enhancement of Doherty Amplifier by Mitigating the Knee Voltage Effect" IEEE Transactions on Microwave Theory and Techniques, vol. 59, No. 1, Jan. 2011.

Moon et al. "A Highly Efficient Doherty Power Amplifier Employing Optimized Carrier Cell." IEEE European Microwave Conference (EuMC). Sep. 2009.

Gustafsson, David. "Theory and Design of Wideband Doherty Power Amplifiers." Chalmers University of Technology. Göteborg, Sweden, 2012.

Peker, Kazim. "Design of a High Efficiency Power Amplifier by Using Doherty Configuration." A Thesis submitted to the Department of Electrical and Electronics Engineering and the Institute of Engineering and Sciences of Bilkent University. Dec. 2010.

Chen et al. "A High Linearity and Efficiency Doherty Power Amplifier for Retrodirective Communication." PIERS Online, vol. 4, No. 2. 2008. 151-156.

\* cited by examiner

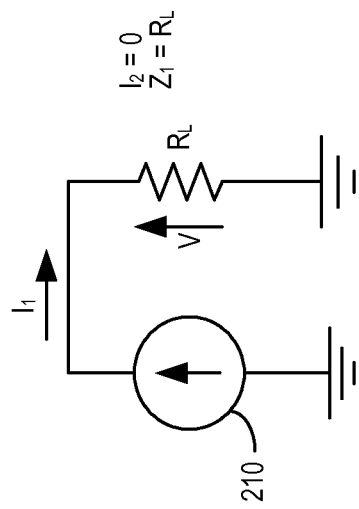
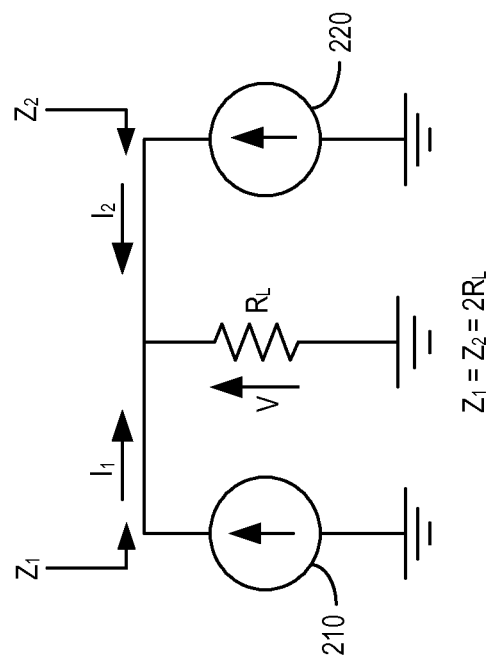
FIG. 2B
FIG. 2A

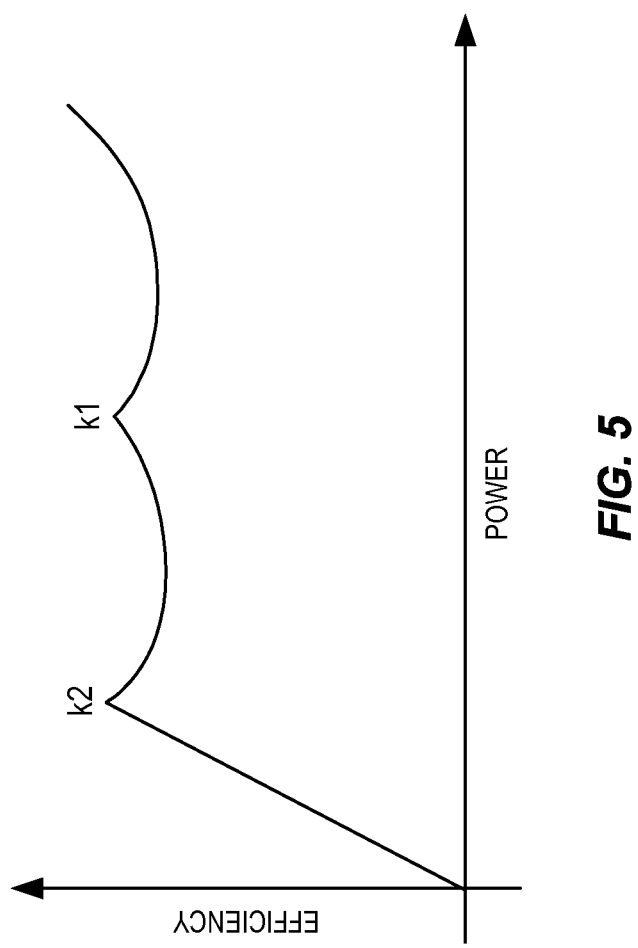

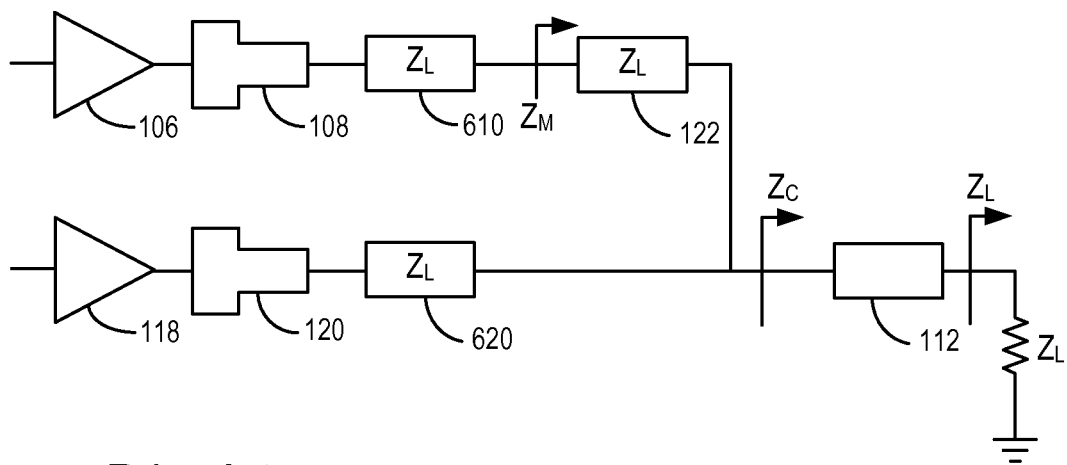
Prior Art     *FIG. 6*
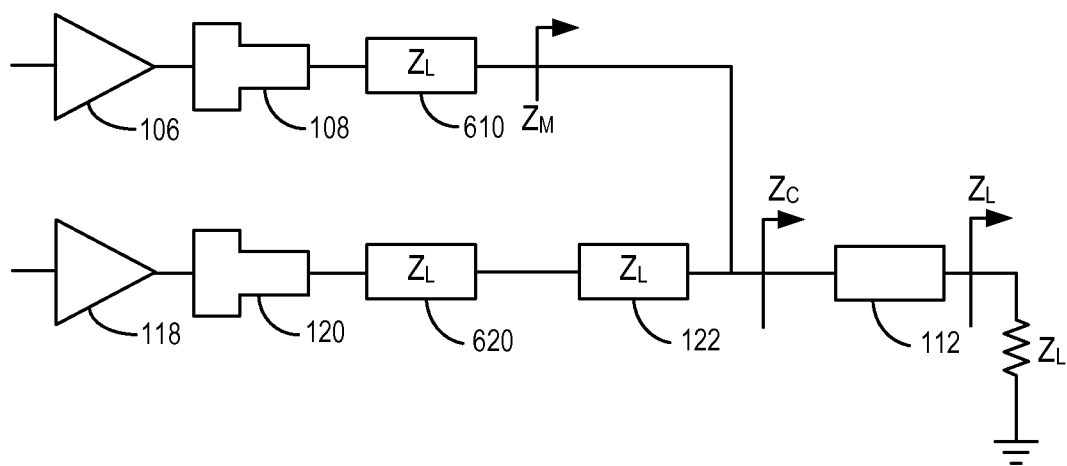
Prior Art     *FIG. 7*

ENHANCED AND VERSATILE N-WAY DOHERTY POWER AMPLIFIER

TECHNICAL FIELD

The present invention generally relates to power amplifier circuits, and more particularly to N-way Doherty amplifier configurations with improved bandwidth.

BACKGROUND

In today's 3rd- and 4th-generation wireless communication systems, complex modulation schemes are used to improve the spectral efficiency of the signals and thus increase system capacity and throughput. In contrast to the constant envelope signals used in earlier wireless systems, the signals in these high-speed wireless networks typically have high peak-to-average power ratios. As a result, the power amplifiers used in system transmitters must be operated in modes that are more linear, but thus less efficient. To increase the efficiencies of the power amplifier system, which in turn reduces system temperatures and power consumption, the well-known Doherty Power Amplifier (PA) architecture is commonly used, often along with a feed-forward or feedback system, allowing the amplifier to operate closer to the saturation region achieving higher efficiency.

FIG. 1 illustrates an example of a conventional Doherty amplifier circuit. In the figure, power amplifier 100 includes two amplifier paths—a carrier amplifier path and a peaking amplifier path—fed by a splitter circuit 102. Splitter circuit 102 divides the input radio-frequency (RF) signal in such a manner that the phase of one output lags the other by 90 degrees, at an operating frequency for the amplifier circuit. In the illustrated configuration, the un-delayed output of splitter 102 is fed to a carrier amplifier path, which includes a carrier amplifier 106, an input matching circuit 104, and an output matching circuit 108. The delayed output of splitter 102 is supplied to a peaking amplifier path, which includes a peaking amplifier 118 and corresponding input and output matching circuits 120. Input matching circuits 104 and 116 and output matching circuits 108 and 118 are typically designed so as to match the amplifiers' input and output impedances to a nominal system impedance. In this case, the system impedance is $Z_L$; a typical system impedance might be 50 ohms, for example.

The carrier amplifier path further includes a quarter-wavelength transformer section 122, coupling the output matching circuit 108 to a summing node 110. In the peaking amplifier path, the output matching circuit 120 is coupled directly to the summing node. A load 114, having a load impedance of $Z_L$, is coupled to the summing node via an impedance transformer 112. Because of the 90-degree phase delay introduced by transformer section 122, the total path delay from the input to splitter 102 to the summing node 110 (and to the load 114) is the same for both the carrier amplifier path and the peaking amplifier path, assuming that the amplifiers 106 and 118 and their corresponding matching circuits are identical, and assuming that amplifiers 106 and 118 are operating at identical operating points. When both amplifiers are operated at their maximum output powers, the signals are in phase at summing node 110, and add constructively. If each amplifier has an output power of $P_{OUT}$, a total of $2*P_{OUT}$ is thus delivered to the load 114, assuming proper matching at the summing node 110.

When the carrier amplifier path and the peaking amplifier path are both delivering power to the summing node, the load impedance observed by each of the carrier amplifier path and the peaking amplifier path is increased, relative to the actual load impedance provided by transformer 112 and load 114. This load modulation is demonstrated in FIG. 2a, where the carrier amplifier path and peaking amplifier path are represented as current sources 210 and 220, respectively, delivering currents I1 and I2 to load resistance $R_L$. The voltage V across load resistance $R_L$ is thus $V=(I_1+I_2)*R_L$. The impedance observed by current source 210, then, is $Z_1=V/I_1=(I_1+I_2)*R_L/I_1$, while the impedance observed by current source 220 is $Z_2=V/I_2=(I_1+I_2)*R_L/I_2$. If $I_1$ and $I_2$ are identical, these impedances are equal: $Z_1=Z_2=2*R_L$. In the context of Doherty amplifiers, this load-pulling effect, whereby the effective impedance observed by each amplifier path is increased as a result of current delivered by the other path, is known as load modulation. It thus can be said that the load at the summing node presents an impedance of $R_L$ when it is not load-modulated, while the same load presents an impedance of $2*R_L$ when it is fully load-modulated.

Referring back to FIG. 1, when both the carrier amplifier path and peak amplifier path are operating at full power, each path observes an effective load impedance that is twice the summing node load impedance $Z_C$, or $2*Z_C$, assuming that carrier amplifier 106 and peaking amplifier 118 are identical. (Load modulation for configurations where the power amplifiers are unequal can be easily derived, using the principles illustrated in FIG. 2A.) For optimal matching of the carrier amplifier path, $2*Z_C$ should be equal to the system impedance $Z_L$. In other words, $Z_C$ should be equal to $Z_L/2$. If the load 114 has an impedance of $Z_L$, this is easily achieved (at the amplifier operating frequency) by providing a quarter-wavelength transformer section 112, having a characteristic impedance equal to the geometric mean of $Z_L$ and $Z_C$, i.e., the square root of the product of $Z_L$ and $Z_C$. For $Z_L=50$ ohms, for example, a transformer section having a characteristic impedance of about 35 ohms will transform the load impedance to an impedance $Z_C=Z_L/2=25$. Note that when this is done, transformer section 122, which has characteristic impedance $Z_L$, is matched to both the output impedance of output matching circuit 108 and to the modulated load impedance $2*Z_C$.

In operation, both the carrier amplifier 106 and the peaking amplifier 118 are active when output power levels at or near full power are required. At full-power, the total power delivered to load 114 is twice the power available from one amplifier alone. (Again, this assumes equal-sized amplifiers—configurations with differently sized amplifiers are well known as well.) When less than half of the full output power is required, peaking amplifier 118 can be deactivated, so that all of the needed power is delivered by the carrier amplifier 106 alone. In this "backoff" mode of operation, the peaking amplifier path ideally presents a very high impedance to the summing node, and the summing node load impedance is no longer modulated, as shown in FIG. 2B. Hence, referring back to FIG. 1, the impedance observed by the carrier amplifier path, looking towards the summing node 110, is an un-modulated load impedance $Z_C$. This load impedance $Z_C$ is transformed by transformer section 122 to an impedance of $(Z_L*Z_L)/Z_C$. Given $Z_L=50$ ohms and $Z_C=25$ ohms, the impedance presented to the output matching circuit 108 is 100 ohms.

It should be appreciated that the carrier amplifier is operating closer to its most efficient operating point in this "backoff" mode of operation, while the peaking amplifier is consuming no power at all. Since the average power in a signal having a high peak-to-average power ratio is considerably lower than the peak power, this means that the Doherty amplifier configuration is more efficient than a single amplifier designed for a similar maximum output power and with similar linearity requirements. For this reason, the Doherty amplifier is widely used in wireless transmitters designed for use in systems employing complex modulation schemes, such as the Long-Term Evolution (LTE) system developed by members of the 3rd-Generation Partnership Project (3GPP). Alternative configurations, variations, and extensions of the basic Doherty amplifier illustrated in FIG. 1, including extensions in which one or more additional peaking amplifier paths are added, have been explored and are well documented. Examples include, but are by no means limited to: U.S. Pat. No. 6,522,201 B1, "RF amplifier having switched load impedance for back-off power efficiency," issued 18 Feb. 2003; International Patent Publication WO 02/054589 A2, "Triple Class E Doherty Amplifier Topology for High Efficiency Signal Transmitters," published 11 Jul. 2002; European Patent Application Publication EP 2 403 135 A1, "Power amplifier for mobile telecommunications," published 4 Jan. 2012; International Patent Publication WO 2012/149976 A1, "Wideband and Reconfigurable Doherty Based Amplifier," published 8 Nov. 2012; and U.S. Pat. No. 7,521,995 B1, "Inverted Doherty Amplifier with Increased Off-State Impedance," issued 21 Apr. 2009.

The operation of the conventional Doherty power amplifier is relatively narrowband because of the way the Doherty combiner is designed, which causes poor efficiency and linearity at the band edge when signal bandwidth increases. The operational bandwidth of telecommunication bands is generally less than 5% of the RF carrier frequencies used in those band, which means that the conventional Doherty power amplifier and its well-known variants have been satisfactory for meeting many of today's requirements. However, newer systems are increasingly multi-band, demanding higher-bandwidth components. At the same time, high-efficiency power amplifiers continue to be demanded, as these allow a radio system to operate at higher output powers and/or with reduced cooling requirements, which can reduce the overall size of the radio unit. When these requirements are coupled with demands for reduced costs and improved time-to-market, the conventional Doherty architecture becomes a design bottleneck due to the narrow bandwidth and added design complexity.

A common technique for increasing efficiency in a Doherty power amplifier is to design an asymmetric 2-way Doherty amplifier. With this approach, the carrier amplifier and peaking amplifier are designed for different maximum power levels; an asymmetric configuration may yield efficiency improvements of several percentage points, compared to the symmetric configuration. Even higher power amplifier efficiency can be achieved by using a 3-way Doherty power architecture, where two peaking amplifier paths are combined with the carrier amplifier path, with the peaking amplifiers activated and deactivated at different back-off power levels.

With both the asymmetric 2-way Doherty amplifier and the 3-way Doherty amplifier, the efficiency degrades at back-off power, primarily due to higher output-combiner losses. Furthermore, the advantages gained with higher efficiencies in even the conventional 2-way Doherty power amplifier are offset by added complexities in the power amplifier design, by the larger printed circuit board areas required. The Doherty amplifier's smaller bandwidth also increases difficulties in linearizing the power amplifier output with digital pre-distorter or feed-forward systems.

Telecommunication equipment providers face many challenges in meeting market demands for multiple radio variants to support various output power capability, frequency bands, and multiple standards such as GSM, WCDMA and LTE. At the same time, there are pressures to reduce development cycle and product cost. Unfortunately, because the conventional Doherty power amplifier architecture is generally optimized only to a specific frequency band and power class, a new development cycle is required each time a system specification is changed. This requires more design resources, longer product development times, and increased manufacturing costs each time there is a new radio variant.

SUMMARY

Problems with conventional Doherty power amplifiers include that impedance transformers in the combining circuit tend to reduce the bandwidth of the power amplifier circuit. As the order of an N-Way Doherty power amplifier increases, the number of impedance transformers increases, resulting in a narrow bandwidth, making design challenging for signals with wider instant signal bandwidth. This also makes it more difficult to linearize the power amplifier output using digital feed-forward or backward systems. Furthermore, the conventional Doherty power amplifier is typically optimized for a specific frequency band and power class, and requires a new design every time one of these specifications changes. Still further, output combiner losses increase for asymmetric and higher order Doherty power amplifiers, reducing overall efficiency.

Several of these problems can be reduced using new Doherty power amplifier configurations disclosed herein and detailed below. These include configurations in which an output of the carrier amplifier circuit is coupled to the summing node in such a way that the impedance observed by the output of the carrier amplifier is substantially equal to the un-modulated load impedance at the combining node, i.e., the load impedance seen at the summing node when all of the peaking amplifiers are turned off. This improves the reduction in bandwidth that normally arises from load modulation and impedance transformation.

Embodiments of the present invention include Doherty power amplifier circuits arranged in both inverting and non-inverting configurations. According to some non-inverting embodiments, a power amplifier circuit is configured to amplify an input signal and provide an amplified signal to a load at a summing node, where the load at the summing node has a first impedance when not load-modulated. The power amplifier circuit in these embodiments includes a splitter network arranged to receive the input signal and to split the input signal to provide a carrier input signal and a peaking input signal, a carrier amplifier path configured to amplify the carrier input signal in a full-power mode and in a first backoff mode, and a peaking amplifier path configured to amplify the peaking input signal in at least the full-power mode.

The carrier amplifier path comprises a carrier amplifier circuit and an impedance transformer in series with an output of the carrier amplifier circuit and connected directly to the summing node. This impedance transformer has a phase length approximately equal to or greater than ninety degrees, at a nominal operating frequency for the power amplifier circuit, and has a designed characteristic impedance value approximately equal to the first impedance. The peaking amplifier path comprises a selectively activatable peaking amplifier circuit configured to be activated in the full-power mode and to be de-activated in at least a first backoff mode. An output of the selectively activatable peaking amplifier circuit is coupled to the summing node, e.g., through a matching circuit and, optionally, a delay line.

In some embodiments, the carrier amplifier path further includes a delay line coupling the output of the carrier amplifier circuit to the first impedance transformer, the delay line having a characteristic impedance approximately equal to the first impedance. In some of these embodiments, the delay line has a phase length substantially shorter than ninety degrees, at a nominal operating frequency for the power amplifier circuit. In some embodiments, the delay line has a length such that a second impedance presented to the output of the carrier amplifier, when the power amplifier circuit is operating in the full-power mode, is shifted, relative to the first impedance, towards an optimal matching impedance for the output of the carrier amplifier.

According to some inverting embodiments, a power amplifier circuit is again configured to amplify an input signal and provide an amplified signal to a load at a summing node, wherein the load at the summing node has a first impedance when not load-modulated. The power amplifier circuit in these embodiments also includes a splitter network arranged to receive the input signal and to split the input signal to provide a carrier input signal and a peaking input signal, a carrier amplifier path configured to amplify the carrier input signal in a full-power mode and in a first backoff mode, and a peaking amplifier path configured to amplify the peaking input signal in at least the full-power mode.

The carrier amplifier path in these embodiments comprises a carrier amplifier circuit having an output coupled to the summing node via a delay line having a characteristic impedance approximately equal to the first impedance, so that an impedance presented to the output is substantially equal to the first impedance when the load at the summing node is not load-modulated. In some embodiments, this delay line may have a phase length substantially shorter than ninety degrees, at a nominal operating frequency for the power amplifier circuit. The peaking amplifier path comprises a selectively activatable peaking amplifier circuit configured to be activated in the full-power mode and to be de-activated in at least a first backoff mode. An output of the selectively activatable peaking amplifier circuit is coupled to the summing node, e.g., via a delay line having a characteristic impedance approximately equal to a nominal system impedance. The purpose of this delay line is to transform the output impedance of the peaking amplifier path to a high impedance, relative to the summing node impedance, when the circuit is operated in backoff mode, so as to avoid load modulating the carrier amplifier device when the peaking amplifier is off.

Optionally, the output of the peaking amplifier circuit is coupled to the summing node via an impedance transformer connected directly to the summing node and having a phase length approximately equal to or greater than ninety degrees, at the nominal operating frequency for the power amplifier circuit, and having a designed characteristic impedance value substantially greater than the first impedance. In some embodiments, the impedance transformer in the peaking amplifier path has a designed characteristic impedance value selected so as to match a load-modulated impedance at the summing node. In other embodiments, this impedance transformer instead has a designed characteristic impedance value substantially greater than a fully-load-modulated impedance at the summing node, so as to improve (i.e., increase) the off-state impedance looking back into the peaking amplifier path from the summing node.

These example amplifier circuit configurations may utilize either a symmetric or asymmetric amplifier configuration. Further, these amplifier configurations may be extended to include two (or more) peaking amplifier paths.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B illustrate load modulation.

FIG. 5 illustrates an efficiency curve corresponding to the 3-way Doherty amplifier circuit of FIG. 4.

FIG. 6 illustrates a conventional, 2-way, non-inverting Doherty amplifier circuit.

FIG. 7 illustrates a conventional, 2-way, inverting Doherty amplifier circuit.

DETAILED DESCRIPTION

Figure 3:
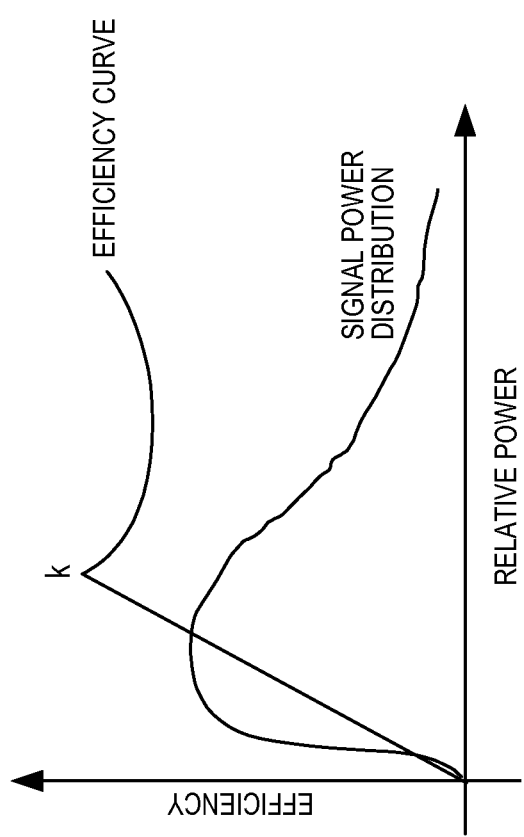
FIG. 3 illustrates an efficiency curve for an example Doherty amplifier configuration, versus a curve illustrating a typical distribution of signal power.

The conventional Doherty power amplifier (PA) has several regions of power operations, depending on its architecture, e.g., whether it is a two-way or 3-way Doherty amplifier. FIG. 3 illustrates an example efficiency curve, where efficiency of a two-way Doherty PA is plotted against the power amplifier's output power. FIG. 3 also illustrates a typical distribution for the actual signal power that is required from a power amplifier. It can be seen that the power amplifier circuit is most often operating in a mode where it is delivering considerably less than its maximum output power. The Doherty amplifier introduces an additional efficiency peak (k), which can be centered at a power level closer to the average or typical output power from the device. This additional efficiency peak (k) corresponds directly to the back-off mode; additional back-off peaks can be introduced by increasing the order of the Doherty PA to a three-way configuration or, more generally, to an N-way configuration.

Figure 1:
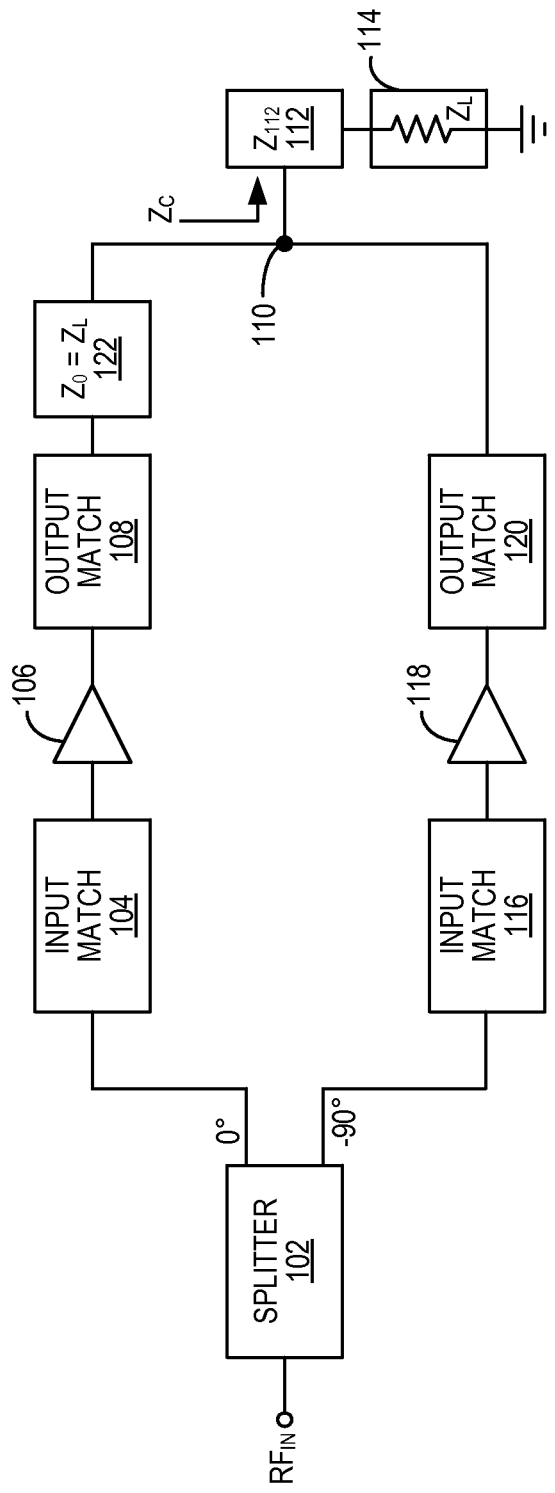
FIG. 1 illustrates a conventional Doherty amplifier circuit.

The power combiner in a conventional Doherty PA configuration, such as the one shown in the two-way configuration illustrated in FIG. 1, handles the load modulation of the devices. With proper load modulation, the peaking amplifier can be turned off ("deactivated") when at back-off power or below, and turned on for full-power operation. More particularly, the peaking amplifier is turned on dynamically, based on the amplitude of the input signal. When the amplitude of the input signal is higher than a threshold level, the peaking amplifier is turned on gradually until it reaches full power. This keeps the devices running as close as possible to their optimum efficiency operating points.

Referring to FIG. 1, assuming a system impedance of $Z_0=Z_L=50$ ohms and assuming identically sized amplifiers in the carrier amplifier and peaking amplifier paths, the optimal impedance at the combiner node is $Z_L/2=25$ ohm at the combiner node. At full power, load modulation causes the carrier amplifier path to see a load impedance of 50 ohms, looking towards the load from output match circuit 108. At back-off power, the 25-ohm load impedance at the combining node is transformed by the transformer section 122 to $2*Z_L=100$ ohms at the output of the carrier amplifier's output match circuit 108.

To further increase efficiency of the Doherty amplifier, designers often use a smaller carrier device, relative to the one or more peaking amplifier devices. This has the effect of shifting the back-off efficiency peak, and can be used to shift the back-off efficiency peak to where most of the signal power distribution is, to increase the overall efficiency. This architecture is called an asymmetric two-way Doherty PA. Another architecture, which is more complex, uses one carrier amplifier and two peak amplifiers and is called a three-way Doherty PA. In this architecture, there is a carrier amplifier device and two peaking amplifier devices that are turned on at different power levels, allowing the efficiency of the overall system to increase due to two efficiency peaks at different back-off powers. This approach can be extended to include more than two peaking amplifiers; thus we can refer to an "N-way" Doherty amplifier, where N is two or greater.

Figure 4:
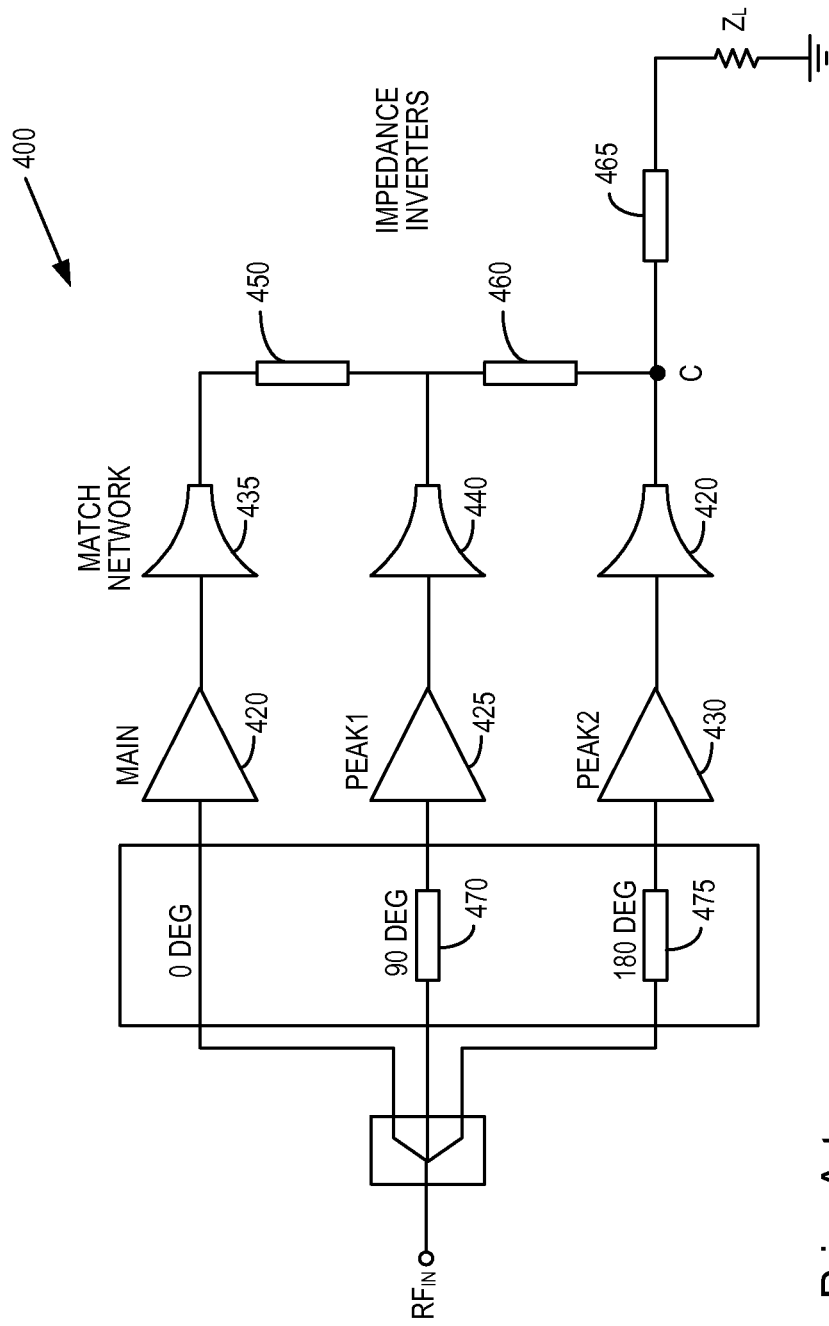
FIG. 4 illustrates an example 3-way Doherty amplifier circuit.

FIG. 4 is a schematic diagram providing a simplified example of a three-way Doherty amplifier circuit 400, based on the non-inverting configuration. Amplifier circuit 400 includes a three-way power splitter 410, main (carrier) amplifier 420, and peaking amplifiers 425 and 430. The amplifiers are succeeded by matching networks 435, 440, and 445, which match their respective amplifiers' outputs to a system impedance $Z_L$, e.g., 50 ohms. Impedance inverters 450 and 460, which may comprise quarter-wavelength transmission line sections, couple the outputs of matching networks 435 and 440 to a combining node C, which is in turn coupled to a system load, with an impedance of $Z_L$, via impedance transformer 465. It will be appreciated that the input signals to the main (carrier) amplifier path and the peaking amplifier paths need to have different phase offsets, to offset the phase shifts caused by the impedance inverters in the combining circuit. In the illustrated circuit, these phase offsets are introduced by transmission-line segments 470 and 475, in the peaking amplifier paths, having lengths of 90 degrees and 180 degrees, respectively. It will be appreciated that these phase shifts are exact only at a nominal operating frequency for the amplifier circuit 400. Thus, the bandwidth of the overall circuit is reduced by the introduction of these additional transmission line segments.

As noted above, device sizing is important, as it determines the location of the efficiency peak relative to the maximum power at back-off. FIG. 5 illustrates an example efficiency curve corresponding to the three-way Doherty PA shown in FIG. 4. Back-off peaks k1 and k2 correspond to turn-on/turn-off points of the first and second peaking amplifiers, respectively. The location of these back-off peaks can be tuned by adjusting the relative sizes of the carrier amplifier and the peaking amplifiers; these relative sizes can be expressed in terms of the maximum output powers of the devices, e.g., according to a main:peak1:peak2 ratio such as:

$$1:m1:m2,$$

where $m1 = \frac{\text{peak 1}}{\text{main}}$ and $m2 = \frac{\text{peak 2}}{\text{main}}$.

This is related to k1 and k2 by the following formula:

$$1:m1:m2=k1 \cdot k2:k1(1-k2):(1-k1),$$

which also can be written as:

$$k2=1+(m1/(m2-1)) \text{ and } k1=1-m2.$$

In a conventional Doherty power amplifier, when matching the amplifiers to their optimal impedances, both the main (carrier) amplifier and the peak amplifiers are matched to 50 ohms impedance when the Doherty amplifier is running at full power. Phase offsets are included to then tune the impedance at back-off power to a different load impedance for optimal performance. This is done when the peak amplifier is off, at low power. When the peak amplifier is turned on, load modulation causes the load observed by the carrier amplifier to modulate.

The power distribution of typical 3rd- and 4th-generation wireless communications devices has a distribution power curve where the average power is 6 to 10 dB below the peak power. This means that a Doherty amplifier in these devices is primarily running in back-off mode, i.e., where the main amplifier is active and at least one peaking amplifier is off. However, in the back-off mode, the main device in a conventional amplifier has a relatively narrow bandwidth, as a result of the load modulation and the quarter-wave impedance transformation of the conventional Doherty combiner.

Problems with conventional Doherty power amplifiers include that impedance inverters (transformers) in the combiner reduce the bandwidth. As the order of an N-Way Doherty power amplifier increases, the number of impedance inverters increases, resulting in a narrow bandwidth, making design challenging for signals with wider instant signal bandwidth (ISBW). This also makes it more difficult to linearize the power amplifier output using digital feed-forward or backward systems. Furthermore, the conventional Doherty power amplifier is typically optimized for a specific frequency band and power class, and requires a new design every time one of these specifications changes. Still further, output combiner losses increase for asymmetric and higher order Doherty power amplifiers, reducing overall efficiency.

Several of these problems can be reduced using the new Doherty power amplifier configurations disclosed herein and detailed below. These include configurations in which an output of the carrier amplifier circuit is coupled to the summing node in such a way that the impedance observed by the output of the carrier amplifier is substantially equal to the un-modulated load impedance at the combining node when the load impedance is not modulated, i.e., when all of the peaking amplifiers are turned off. This improves the reduction in bandwidth that normally arises from load modulation and impedance transformation.

FIG. 6 shows key features of a conventional two-way Doherty amplifier in the non-inverting configuration, while FIG. 7 illustrates a conventional two-way Doherty amplifier in the inverting configuration. The input power splitter is omitted from these figures, to simplify the figures. In both figures, quarter-wavelength transformer section 112 transforms the system load impedance $Z_L$ to a combining load impedance $Z_C$. For a symmetric two-way Doherty amplifier configuration, $Z_C$ is generally chosen to be equal to $Z_L/2$, for the configurations shown in FIGS. 6 and 7. In an asymmetric configuration, the value of $Z_C$ is adjusted so that the modulated load impedance, at full output power, is substantially equal to the system impedance $Z_L$.

In both figures, the main amplifier path includes a main amplifier 106, a matching network 108, and a delay line 610. Delay line 610 has a characteristic impedance of $Z_L$, corresponding to the system impedance, and is generally substantially shorter than one-quarter of a wavelength at the nominal operating frequency for the amplifier circuit. The matching network 108 provides an output match of $Z_L$; thus, the delay line 610 is matched to the output of matching network 108. The length of delay line 610 is chosen to optimize the matching of carrier amplifier 106 to the summing node impedance when in back-off mode. Because the characteristic impedance of the delay line 610 is matched to the system impedance, the delay line 610 has no effect in full-power mode in this conventional configuration.

In both figures, the peak amplifier path includes a peaking amplifier 118, a peaking amplifier matching network 120, and a delay line 620. Like its counterpart in the main amplifier path, matching network 120 matches the output of peaking amplifier 118 to the system impedance $Z_L$. Likewise, delay line 620 has a characteristic impedance of $Z_L$, and is thus matched to the output of matching network 120. The length of delay line 620 is chosen to transform the output impedance of the peaking amplifier 118, as transformed by matching network 120, to a high impedance as observed from the combining node when the peaking amplifier 118 is deactivated, so as to avoid load modulating the carrier amplifier and so as to reduce power leakage into the peaking amplifier path.

In the non-inverting configuration shown in FIG. 6, the main amplifier path includes a quarter-wavelength (90-degree) impedance transformer section 122, also having a characteristic impedance of $Z_L$. As described earlier, this impedance transformer section 122 is simply a delay element in full-power mode, as the impedance at the combining node is modulated in full-power mode so that it is substantially equal to the system impedance $Z_L$. In back-off mode, the transformer section 122 transforms the combining node load impedance so that the load $Z_M$ seen by the output of the delay line 610, looking towards the system load, differs substantially from both the system impedance $Z_L$ and the un-modulated combining node impedance $Z_C$. In a symmetric configuration where $Z_L$=50 ohms and $Z_L$=25 ohms, for example, the impedance $Z_M$ observed by the delay line 610 in back-off mode is thus $2*Z_L$=100 ohms. It will be appreciated, however, that the delay line will further transform the load, so that the load observed by the output of the matching circuit 108 is somewhat different than that observed at the output of delay line 610.

In the inverting configuration illustrated in FIG. 7, the quarter-wavelength impedance transformer section 122 is found in the peaking amplifier path, rather than in the main amplifier path. In this configuration, the output of delay line 610 (in the main amplifier path) sees a load impedance $Z_M$ that is equal to the modulated load impedance at full power, and equal to the un-modulated load impedance $Z_C$ in back-off mode. Thus, given a symmetric configuration and a system impedance of 50 ohms, $Z_M$=50 ohms in full-power mode and 25 ohms in back-off mode. It should be noted that the quarter-wavelength impedance transformer section 122 can be omitted from the peaking amplifier path, if an equal-phase power divider is used to generate the inputs to amplifiers 106 and 118, rather than a hybrid (ninety-degree phase shifting) power divider.

Figure 8:
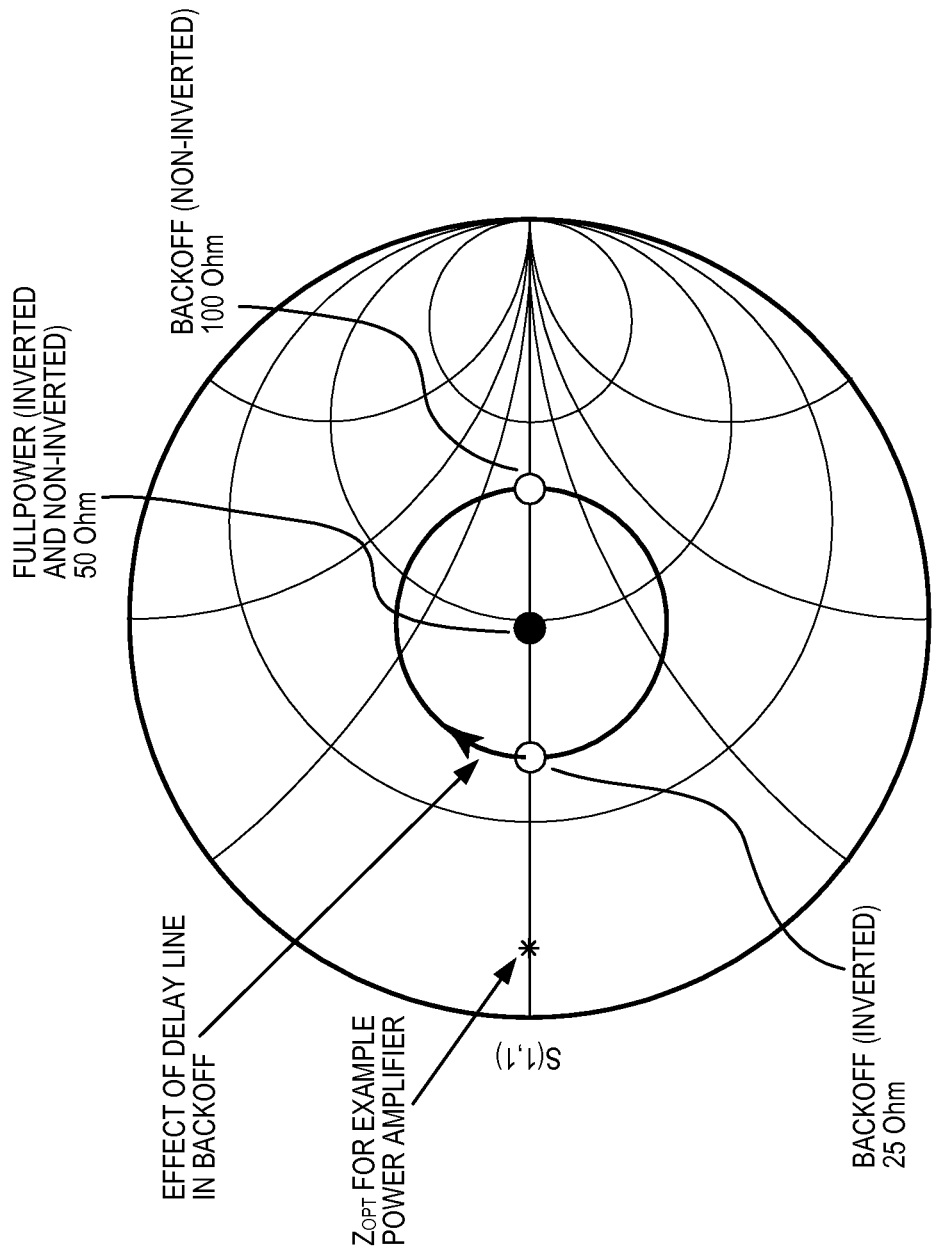
FIG. 8 is a Smith chart illustrating impedances in backoff and full-power modes, for the circuits of FIGS. 6 and 7.

FIG. 8 illustrates the impedances $Z_M$ presented to the delay line 610 in the main amplifier path for both the inverting and non-inverting cases, as plotted on a simplified Smith chart. The figure is based on a system impedance $Z_L$ of 50 ohms, assuming a symmetric Doherty amplifier configuration; thus, the center of the chart represents 50 ohms, or a reflection coefficient of zero. The dots on the figure represent the impedances at the nominal operating frequency (e.g., 1 GHz) for the amplifier circuit. It will be appreciated that the impedance $Z_M$ will deviate from these points as the actual frequency changes. It should further be appreciated that the back-off-mode impedances seen by the matching network 108 will differ slightly from those observed by the delay line 610, because of the transforming action of the delay line 610.

As seen in FIG. 8, the delay line 610 (and the matching network 108) sees $Z_L$=50 ohms at full power, for both the inverting and non-inverting configurations. In non-inverting mode, then transformer section 122 transforms the junction impedance $Z_C$=25 ohms to 100 ohms, at back-off power. This is because the characteristic impedance of transformer section is equal to $Z_L$=50 Ohm. In the inverting configuration, there is no transmission line between the delay line 610 and the junction of the combiner. Hence, at back-off mode, $Z_L/2$=25 Ohm is presented to delay line 610.

Several other observations may be made from FIG. 8. In the figure, an example optimum matching point $Z_{OPT}$ for the carrier amplifier circuit is plotted. In this example, $Z_{OPT}$ is a relatively low impedance. The inverting configuration might be selected, in this case, at this configuration provides impedances, looking towards the summing node, of 25 ohms and 50 ohms, respectively, in backoff mode and full-power mode. The distance between these impedances and the optimum matching point $Z_{OPT}$ is shorter than for the corresponding impedances in the non-inverting configuration. However, the effect of delay line 610 is to shift the impedance looking towards the summing node away from $Z_{OPT}$ when the circuit is operating in backoff mode, thus worsening the match across a wider bandwidth. The delay line 610 has no impact on the match in full-power mode.

Figure 9:
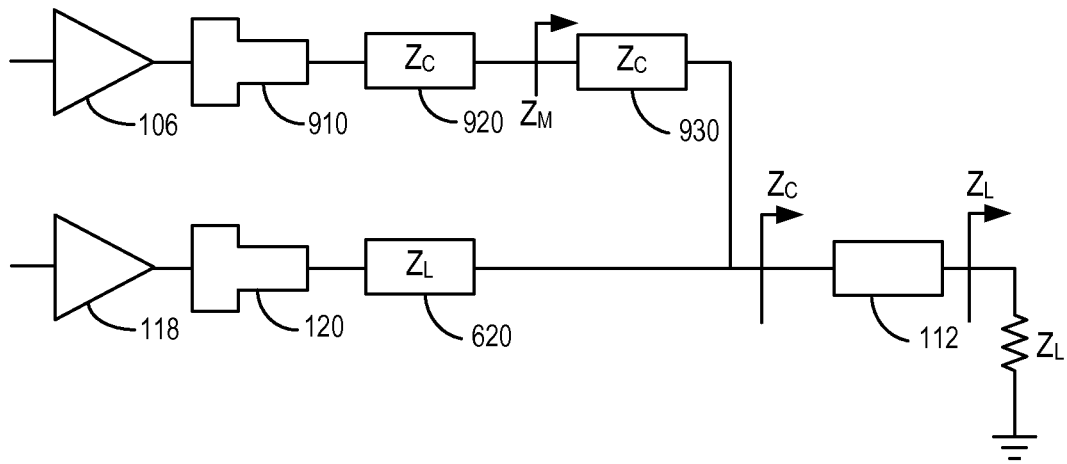
FIG. 9 illustrates a 2-way, non-inverting Doherty amplifier according to some embodiments of the present invention.
Figure 10:
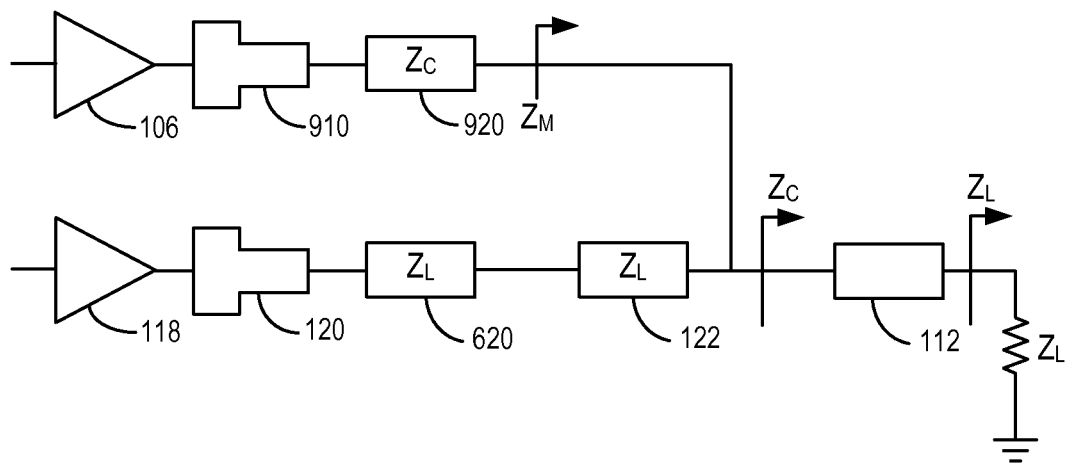
FIG. 10 illustrates a 2-way, inverting Doherty amplifier according to some embodiments of the present invention.

FIGS. 9 and 10 illustrate modified Doherty power amplifier circuits according to embodiments of the present invention. FIG. 9 illustrates a non-inverting configuration, while FIG. 10 shows an inverting configuration. Again, the input power splitters are omitted, to simplify the figures.

The non-inverting amplifier configuration shown in FIG. 9 can be compared with that of FIG. 6. The peaking amplifier paths, comprising peaking amplifier 118, matching circuit 120, and delay line 620, are the same in each figure, although the delay line 620 and/or matching circuit 120 may be modified in variants of the illustrated circuit, e.g., by utilizing a higher impedance delay for either or both, to improve the off-state output impedance of the peaking amplifier path.

The carrier amplifier paths in FIGS. 6 and 9 are superficially similar, each comprising a carrier amplifier 106, coupled to a summing node via respective matching circuits, delay lines, and quarter-wavelength transformers. However, the delay line 610 and transformer section 122 in FIG. 6 both have a designed characteristic impedance that is equal to the fully-modulated impedance at the summing node, i.e., $Z_L$. In contrast, the delay line 920 and transformer section 930 in FIG. 9 both have a designed characteristic impedance that is equal to the impedance at the summing node when it is not modulated, i.e., $Z_C$.

Similarly, the inverting amplifier configuration shown in FIG. 10 can be compared with that of FIG. 7. The peaking amplifier paths, comprising peaking amplifier 118, matching circuit 120, delay line 620, and transformer section 122, are the same in each figure although the transformer section 122 and delay line 620 may be modified in variants of the illustrated circuit. In particular, it should be noted that the transformer section 122 may be omitted entirely, in some embodiments, so that the output of peaking amplifier 118 and matching circuit 120 is coupled to the summing node via only a delay line 620, which may have a characteristic impedance equal to a nominal system impedance, for example. The purpose of this delay line is to transform the output impedance of the peaking amplifier path to a high impedance, relative to the summing node impedance, when the circuit is operated in backoff mode, so as to avoid load modulating the carrier amplifier device when the peaking amplifier is off. In these embodiments, the power splitter circuit. In embodiments where the transformer section 122 is omitted, the power splitter circuit providing the input signals to amplifiers 106 and 118 should be an equal-phase power splitter, rather than the hybrid (90-degree phase shifting) power splitter that would otherwise be used.

The carrier amplifier paths in FIGS. 7 and 10 are again superficially similar, each comprising a carrier amplifier 106, coupled to a summing node via respective matching circuits and delay lines. However, the delay line 610 in FIG. 7 has a designed characteristic impedance that is equal to the fully-modulated impedance at the summing node, i.e., $Z_L$. In contrast, the delay line 920 in FIG. 10 has a designed characteristic impedance that is equal to the impedance at the summing node when it is not modulated, i.e., $Z_C$.

The consequence of this difference in both FIGS. 9 and 10 is that the impedance observed by the output of the carrier amplifier's matching circuit 910 is not transformed, relative to the load impedance at the summing node, when the circuit is operating in backoff mode, i.e., with the peaking amplifier 118 deactivated. This is because the characteristic impedances of the delay lines 910 and transformer section 920 are $Z_C$, thus matching the summing node impedance when it is not load-modulated, i.e., when peaking amplifier 118 is deactivated. In the circuits illustrated in FIGS. 6 and 7, on the other hand, the summing node impedance at backoff mode ($Z_C$) is transformed to a quite different impedance by transformer section 122 and delay line 610, for the non-inverting case, or by delay line 610 alone, for the inverting case.

Figure 11:
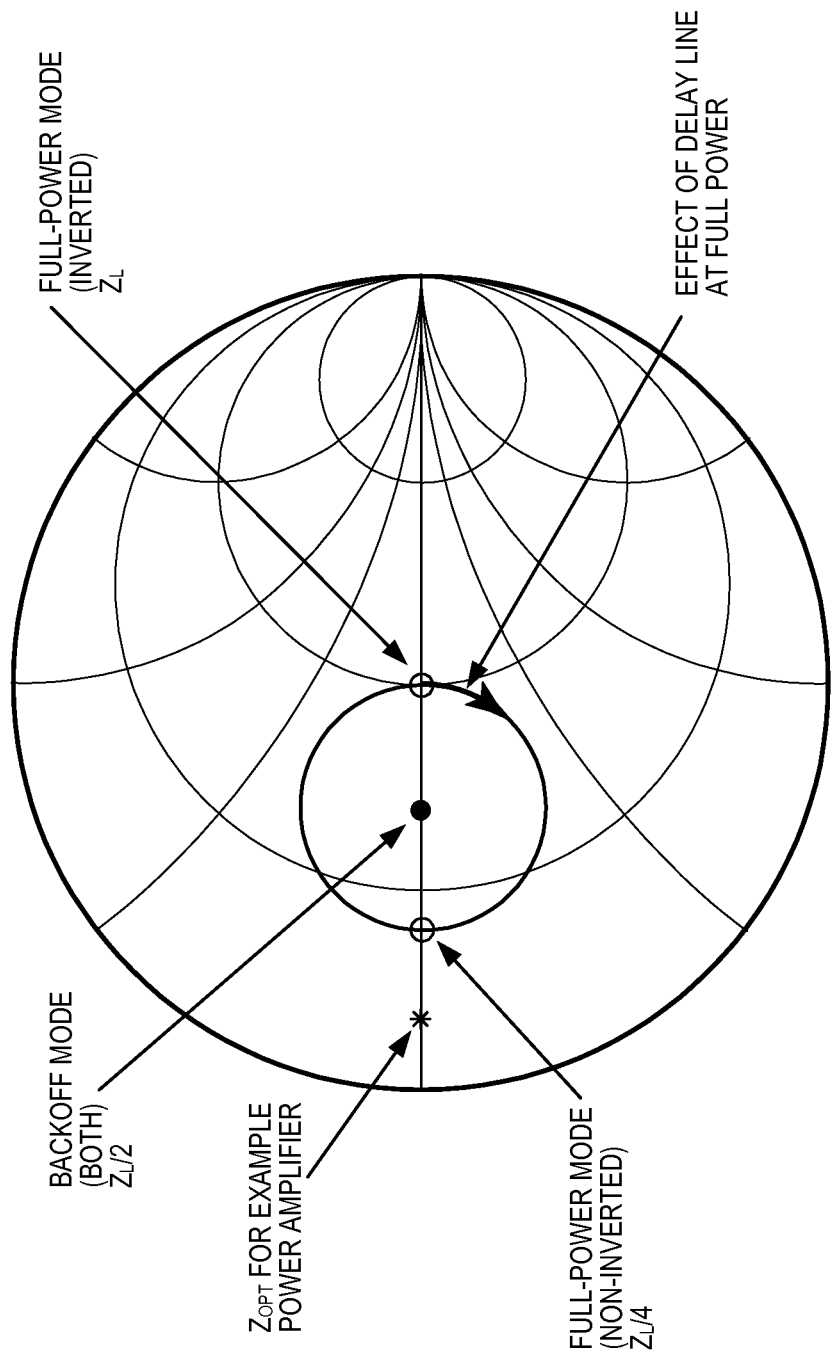
FIG. 11 is a Smith chart illustrating impedances in backoff and full-power modes, for the circuits of FIGS. 9 and 10.

This can be seen in the Smith chart shown in FIG. 11 which illustrates the impedances $Z_M$ presented to the delay line 610 in the main amplifier path for the non-inverting and inverting cases shown in FIGS. 9 and 10, respectively. Again, the figure is based on a system impedance $Z_L$ of 50 ohms, assuming a symmetric Doherty amplifier configuration; thus, the center of the chart represents 50 ohms, or a reflection coefficient of zero. The dots on the figure represent the impedances at the nominal operating frequency (e.g., 1 GHz) for the amplifier circuit. It will be appreciated that the impedance $Z_M$ will deviate from these points as the actual frequency changes. It should further be appreciated that in this case the full-power-mode impedances seen by the matching network 108 will differ slightly from those observed by the delay line 610, because of the transforming action of the delay line 610.

As seen in FIG. 11, the delay line 920 (and the matching network 910) sees $Z_C=Z_L/2=25$ ohms in backoff mode, for both the inverting and non-inverting configurations. In the non-inverting configuration, transformer section 930 transforms the load-modulated junction impedance $Z_L=50$ ohms to $Z_L/4=12.5$ ohms, at full power. This is because the characteristic impedance of transformer section 930 is equal to $Z_C=25$ Ohm. In the inverting configuration, there is no transformer section between the delay line 920 and the junction of the combiner. Hence, in full-power mode in the inverting configuration, the fully-modulated load impedance $Z_L=50$ ohms is presented to delay line 920.

An example optimum matching point $Z_{OPT}$ for the carrier amplifier circuit is also plotted in FIG. 11. Again, $Z_{OPT}$ is relatively low impedance, in this example. It will be appreciated that the impedances are generally closer to the optimum matching point $Z_{OPT}$ than was the case in FIG. 8. In this case, however, the delay line 920 has no impact in backoff mode. In full-power mode, the effect of delay line 920 in the inverting mode is to shift the impedance looking towards the summing node towards $Z_{OPT}$, thus improving the match.

With the particular examples shown in FIGS. 9 and 10 in mind it will be appreciated that embodiments of the present invention include Doherty power amplifier circuits arranged in both inverting and non-inverting configurations. According to some non-inverting embodiments, e.g., as shown in FIG. 9, a power amplifier circuit is configured to amplify an input signal and provide an amplified signal to a load at a summing node, wherein the load at the summing node has a first impedance (e.g., $Z_C$, as shown in FIG. 9) when not load-modulated. The power amplifier circuit in these embodiments includes a splitter network (e.g., as shown in FIG. 1) arranged to receive the input signal and to split the input signal to provide a carrier input signal and a peaking input signal, a carrier amplifier path configured to amplify the carrier input signal in a full-power mode and in a first backoff mode, and a peaking amplifier path configured to amplify the peaking input signal in at least the full-power mode. One benefit of using this non-inverting topology is that additional peaking stages can be easily added to the summing node without affecting the design of the previous stage, since $Z_C$ will not change at backoff modes. This is very beneficial as the conventional Doherty requires a new design every time a peaking stage is added. This allows the design to be versatile and expendable to achieve higher average efficiency and rapid design time.

The carrier amplifier path comprises a carrier amplifier circuit and an impedance transformer in series with an output of the carrier amplifier circuit and connected directly to the summing node. This impedance transformer has a phase length approximately equal to or greater than ninety degrees, at a nominal operating frequency for the power amplifier circuit, and has a designed characteristic impedance value approximately equal to the first impedance. The peaking amplifier path comprises a selectively activatable peaking amplifier circuit (e.g., peaking amplifier 118, as shown in FIG. 9) configured to be activated in the full-power mode and to be de-activated in at least a first backoff mode. An output of the selectively activatable peaking amplifier circuit is coupled to the summing node, e.g., through a matching circuit 120 and, optionally, a delay line 620.

In some embodiments, the carrier amplifier path further includes a delay line coupling the output of the carrier amplifier circuit to the first impedance transformer, the delay line having a characteristic impedance approximately equal to the first impedance. In some of these embodiments, the delay line has a phase length substantially shorter than ninety degrees, at a nominal operating frequency for the power amplifier circuit. In some embodiments, the delay line has a length such that a second impedance presented to the output of the carrier amplifier, when the power amplifier circuit is operating in the full-power mode, is shifted, relative to the first impedance, towards an optimal matching impedance for the output of the carrier amplifier.

According to some inverting embodiments, e.g., as shown in FIG. 10, a power amplifier circuit is again configured to amplify an input signal and provide an amplified signal to a load at a summing node, wherein the load at the summing node has a first impedance (e.g., $Z_C$, as shown in FIG. 10) when not load-modulated. The power amplifier circuit in these embodiments also includes a splitter network (e.g., as shown in FIG. 1) arranged to receive the input signal and to split the input signal to provide a carrier input signal and a peaking input signal, a carrier amplifier path configured to amplify the carrier input signal in a full-power mode and in a first backoff mode, and a peaking amplifier path configured to amplify the peaking input signal in at least the full-power mode.

The carrier amplifier path in these embodiments comprises a carrier amplifier circuit having an output coupled to the summing node via a delay line having a characteristic impedance approximately equal to the first impedance, so that an impedance presented to the output is substantially equal to the first impedance when the load at the summing node is not load-modulated. In some embodiments, this delay line may have a phase length substantially shorter than ninety degrees, at a nominal operating frequency for the power amplifier circuit. The peaking amplifier path comprises a selectively activatable peaking amplifier circuit (e.g., peaking amplifier 118, as shown in FIG. 9) configured to be activated in the full-power mode and to be de-activated in at least a first backoff mode. An output of the selectively activatable peaking amplifier circuit is coupled to the summing node, e.g., via a delay line having a characteristic impedance approximately equal to or greater than a nominal system impedance.

In some embodiments, the output of the selectively activatable peaking amplifier circuit is coupled to the summing node via an impedance transformer connected directly to the summing node and having a phase length approximately equal to or greater than ninety degrees, at the nominal operating frequency for the power amplifier circuit, and having a designed characteristic impedance value substantially greater than the first impedance. This impedance transformer is not required, however, if the power splitter is an equal-phase power splitter. In some embodiments, the impedance transformer in the peaking amplifier path has a designed characteristic impedance value selected so as to match a load-modulated impedance at the summing node, e.g., $Z_L$, as shown in FIG. 10. In other embodiments, this impedance transformer instead has a designed characteristic impedance value substantially greater than a fully-load-modulated impedance at the summing node, so as to improve (i.e., increase) the off-state impedance looking back into the peaking amplifier path from the summing node.

The example impedance values given above for the amplifier circuits shown in FIGS. 9 and 10 assume a symmetric amplifier configuration, i.e., where the carrier amplifier and peaking amplifier devices are identically sized, so as to contribute equal power to the load when operating in full-power mode. It will be appreciated, however, that the illustrated configurations may also utilize an asymmetric amplifier configuration, with the same adjustments to $Z_C$ as would be made for the conventional configurations shown in FIGS. 6 and 7.

Figure 12:
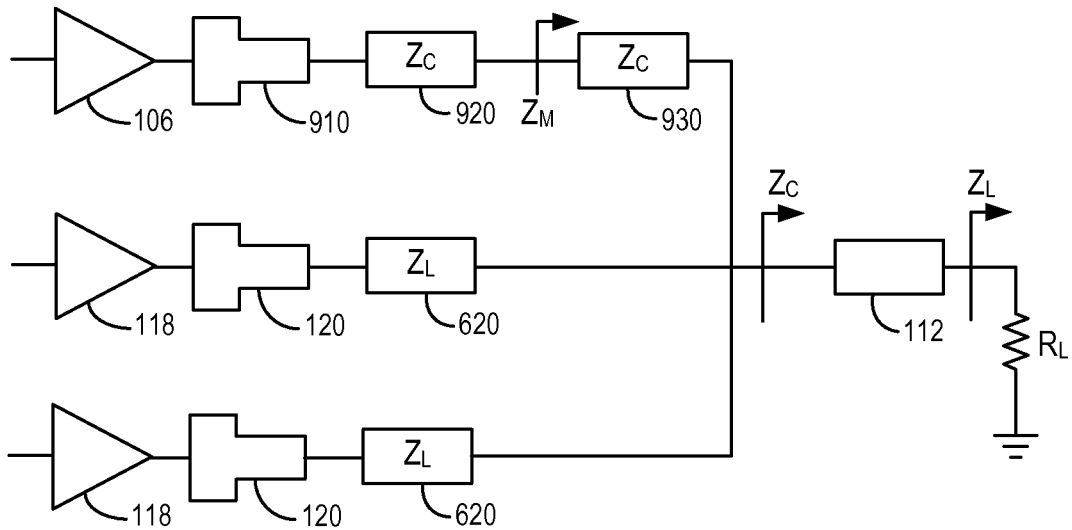
FIGS. 12 and 13 illustrate example 3-way Doherty amplifier circuits.
Figure 13:
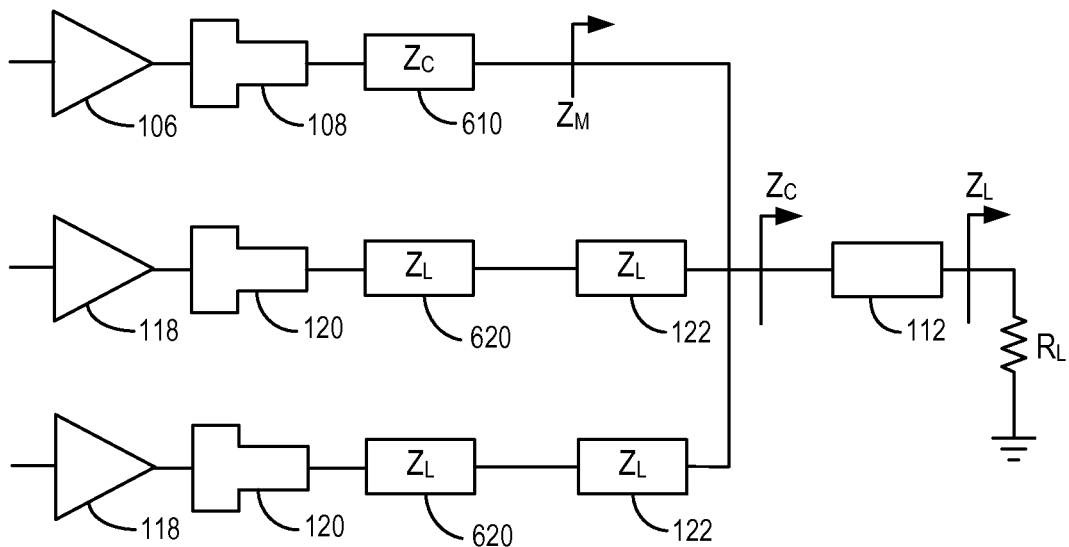

It should also be appreciated that the two-way Doherty amplifier configurations illustrated in FIGS. 9 and 10 can be extended to include two (or more) peaking amplifier paths. Thus, the techniques described herein, while illustrated in the context of two-way Doherty amplifier circuits, are more generally applicable to N-way Doherty amplifier circuits. Examples of three-way non-inverting and inverting configurations are shown in FIGS. 12 and 13, respectively, each of which includes a second peaking amplifier path, where the second peaking amplifier path is deactivated in one backoff mode and activated in another and in the full-power mode. It should be noted that the un-modulated load impedance $Z_C$ in these circuits should be modified, relative to the corresponding two-way configurations, in the same way that it would be done for a conventional N-way Doherty amplifier circuit. For example, assuming a symmetric configuration, $Z_C$ might be approximately 16.7 ohms, given a nominal system impedance of 50 ohms. The characteristic impedances of the impedance transformer 930 and/or delay line 920 in the carrier amplifier path should be adjusted accordingly, so that the output of the matching circuit 910 sees an impedance of $Z_C$ when the circuit is operating in full back-off mode. When fully modulated, i.e., when all three amplifiers are operating at full power, the modulated load impedance at the summing node will then equal 50 ohms.

Several example circuits have been illustrated and described in detail, to convey the principles and operation of the present invention. Those skilled in the art will appreciate that these circuits can be modified and adapted in various ways, while still operating according to these principles. Thus, it should be understood that the present invention is not limited by the details provided in the foregoing description, nor is it limited by the specific values, parameters, and features of the accompanying drawings. Instead, the present invention is limited only by the following claims and their legal equivalents.

What is claimed is:

1. A power amplifier circuit for amplifying an input signal and providing an amplified signal to a load at a summing node, wherein the load at the summing node has a first impedance when not load-modulated, the power amplifier circuit comprising:
    a splitter network arranged to receive the input signal and to split the input signal to provide a carrier input signal and a peaking input signal;
    a carrier amplifier path configured to amplify the carrier input signal in a full-power mode and in a first backoff mode and comprising a carrier amplifier circuit and a first impedance transformer in series with an output of the carrier amplifier circuit and connected directly to the summing node, the first impedance transformer having a phase length approximately equal to or greater than ninety degrees, at a nominal operating frequency for the power amplifier circuit, and having a designed characteristic impedance value approximately equal to the first impedance;
    a peaking amplifier path configured to amplify the peaking input signal in at least the full-power mode and comprising a selectively activatable peaking amplifier circuit configured to be activated in the full-power mode and to be de-activated in at least a first backoff mode, wherein an output of the selectively activatable peaking amplifier circuit is coupled to the summing node; and
    a delay line coupling the output of the carrier amplifier circuit to the first impedance transformer, the delay line having a characteristic impedance approximately equal to the first impedance, wherein the delay line has a phase length substantially shorter than ninety degrees, at a nominal operating frequency for the power amplifier circuit.

2. The power amplifier circuit of claim 1, wherein the delay line has a length such that a second impedance presented to the output of the carrier amplifier, when the power amplifier circuit is operating in the full-power mode, is shifted, relative to the first impedance, towards an optimal matching impedance for the output of the carrier amplifier.

3. The power amplifier circuit of claim 1, wherein the splitter network is further arranged to provide a second peaking amplifier input signal, and wherein the power amplifier circuit further comprises:
    a second peaking amplifier path configured to selectively amplify the second peaking amplifier input signal in the peaking mode and in the first backoff mode and to be deactivated in at least a second backoff mode, the second peaking amplifier path comprising a second selectively activatable peaking amplifier circuit having an output coupled to the summing node.

4. A power amplifier circuit for amplifying an input signal and providing an amplified signal to a load at a summing node, wherein the load at the summing node has a first impedance when not load-modulated the power amplifier circuit comprising:

a splitter network arranged to receive the input signal and to split the input signal to provide a carrier input signal and a peaking input signal;

a carrier amplifier path configured to amplify the carrier input signal in a full-power mode and in each of one or more backoff modes and comprising a carrier amplifier circuit having an output coupled to the summing node via a delay line having a characteristic impedance approximately equal to the first impedance, so that an impedance presented to the output is substantially equal to the first impedance when the load at the summing node is not load-modulated; and a first peaking amplifier path configured to amplify the peaking input signal in at least the full-power mode and comprising a first selectively activatable peaking amplifier circuit configured to be activated in the full-power mode and to be de-activated in at least a first backoff mode, wherein an output of the first selectively activatable peaking amplifier circuit is coupled to the summing node via a first impedance transformer connected directly to the summing node and having a phase length approximately equal to or greater than ninety degrees, at the nominal operating frequency for the power amplifier circuit, and having a designed characteristic impedance value substantially greater than the first impedance.

5. The power amplifier circuit of claim 4, wherein the first impedance transformer has a designed characteristic impedance value selected so as to match a load-modulated impedance at the summing node.

6. The power amplifier circuit of claim 4, wherein the first impedance transformer has a designed characteristic impedance value substantially greater than a fully-load-modulated impedance at the summing node.

7. The power amplifier circuit of claim 4, wherein the delay line has a phase length substantially shorter than ninety degrees, at a nominal operating frequency for the power amplifier circuit.

8. The power amplifier circuit of claim 4, wherein the splitter network is further arranged to provide a second peaking amplifier input signal, and wherein the power amplifier circuit further comprises:

a second peaking amplifier path configured to selectively amplify the second peaking amplifier input signal in the peaking mode and in the first backoff mode and to be deactivated in at least a second backoff mode, the second peaking amplifier path comprising a second selectively activatable peaking amplifier circuit having an output coupled to the summing node.

* * * * *